(12) United States Patent
Suo et al.

(10) Patent No.: US 11,700,064 B2
(45) Date of Patent: Jul. 11, 2023

(54) SIGNAL PROCESSING APPARATUS AND SIGNAL PROCESSING METHOD

(71) Applicant: HUAWEI TECHNOLOGIES CO., LTD., Guangdong (CN)

(72) Inventors: Jing Suo, Dongguan (CN); Xiaolu Song, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/584,725

(22) Filed: Jan. 26, 2022

(65) Prior Publication Data

US 2022/0149949 A1 May 12, 2022

Related U.S. Application Data (63) Continuation of application No. PCT/CN2020/082966, filed on Apr. 2, 2020.

(30) Foreign Application Priority Data

Jul. 26, 2019 (CN) .......................... 201910684048.1

(51) Int. Cl.
*H04B 10/04* (2006.01)
*H04B 10/508* (2013.01)
(Continued)

(52) U.S. Cl.
CPC ......... *H04B 10/508* (2013.01); *H04B 10/503* (2013.01); *H04B 10/506* (2013.01); *H04B 10/614* (2013.01); *H04J 14/0205* (2013.01)

(58) Field of Classification Search
CPC .. H04B 10/508; H04B 10/614; H04B 10/506; H04B 10/503; H04B 10/541;
(Continued)

(56) References Cited

U.S. PATENT DOCUMENTS 8,446,305 B1 * 5/2013 Zanoni .................. H03M 1/124
341/137
8,548,331 B1 * 10/2013 Zanoni .................. H04B 10/90
398/115
(Continued)

FOREIGN PATENT DOCUMENTS

CN 102722059 A 10/2012
CN 103488023 A 1/2014
(Continued)

OTHER PUBLICATIONS

Chao et al., "Microwave Photonic Signal Processing Using Fiber Bragg Gratings," Journal of Data Acquisition and Processing, vol. 29, No. 6, Nov. 2014, 15 pages.
(Continued)

*Primary Examiner* — Hanh Phan
(74) *Attorney, Agent, or Firm* — Fish & Richardson P.C.

(57) ABSTRACT

This application provides example signal processing apparatus and example signal processing method. One example signal processing apparatus includes a sampling unit, a beam combiner, and an optical resonator. The sampling unit is connected to the beam combiner, and the beam combiner is connected to the optical resonator. The sampling unit is configured to sample an analog signal by using an optical pulse signal to output a sampled optical pulse signal. The beam combiner is configured to combine the sampled optical pulse signal and a multi-wavelength optical signal into a first optical signal. The optical resonator is configured to perform resonance based on the first optical signal to output a second
(Continued)

optical signal in the first optical signal, where a wavelength of the second optical signal is equal to a resonant wavelength of the optical resonator.

20 Claims, 8 Drawing Sheets

(51) Int. Cl.
  *H04B 10/50* (2013.01)
  *H04B 10/61* (2013.01)
  *H04J 14/02* (2006.01)

(58) Field of Classification Search
  CPC .. H04B 10/516; H04B 10/5561; H04B 10/58; H04B 10/548; H04J 14/02; H04L 7/0075; H03M 1/124; H03M 1/1245; H03M 1/1205; H03M 1/12
  USPC ....... 398/183, 188, 186, 187, 189, 115, 202, 398/208, 209, 135, 136, 154, 155, 158, 398/159, 79; 341/137, 155, 132, 144
  See application file for complete search history.

(56) References Cited

U.S. PATENT DOCUMENTS

| | | | |
|---|---|---|---|
| 8,965,211 B1 * | 2/2015 | Zanoni | H04B 10/61 398/208 |
| 9,201,287 B1 | 12/2015 | Taylor | |
| 2008/0205461 A1 | 8/2008 | Henrichs | |

FOREIGN PATENT DOCUMENTS

| | | |
|---|---|---|
| CN | 104567958 A | 4/2015 |
| CN | 106602403 A | 4/2017 |

OTHER PUBLICATIONS

Khang et al., "Lumped Time-Delay Compensation Scheme for Coding Synchronization in the Nonlinear Spectral Quantization-Based All Optical Analog-to-Digital Conversion," IEEE Photonics Journal, vol. 5, No. 6, Oct. 2013, 12 pages.

Nagashima et al., "40 GSample/s All-Optical Analog to Digital Conversion With Resolution Degradation Prevention," IEEE Photonics Technology Letters, vol. 29, No. 1, Jan. 2017, 4 pages.

Nishitani et al., "Resolution Improvement of All-Optical Analog-to-Digital Conversion Employing Self-frequency Shift and Self-Phase-Modulation-Induced Spectral Compression," IEEE Journal of Selected Topics in Quantum Electronics, vol. 14, No. 3, May 2008, 9 pages.

Office Action issued in Chinese Application No. 201910684048.1 dated Jun. 17, 2021, 17 pages (with English translation).

PCT International Search Report and Written Opinion issued in International Application No. PCT/CN2020/082966 dated Jun. 30, 2020, 18 pages (with English translation).

Ya et al., "Real-Time and High-Speed All-Optical Quantization by Slicing Supercontinuum Spectrum," Laser & Optoelectronics Progress, Mar. 2018, 6 pages (with English abstract).

* cited by examiner

SIGNAL PROCESSING APPARATUS AND SIGNAL PROCESSING METHOD

CROSS-REFERENCE TO RELATED APPLICATIONS

This application is a continuation of International Patent Application No. PCT/CN2020/082966, filed on Apr. 2, 2020, which claims priority to Chinese Patent Application No. 201910684048.1, filed on Jul. 26, 2019. The disclosures of the aforementioned applications are hereby incorporated by reference in their entireties.

TECHNICAL FIELD

This application relates to the signal processing field, and more specifically, to a signal processing apparatus and a signal processing method.

BACKGROUND

Most of information in nature exists in the form of analog signals. As various digital devices are widely applied, an analog signal needs to be converted into a digital signal for processing. An optical analog-to-digital converter (ADC) is a device that converts an analog signal into a corresponding digital signal, and builds a bridge between a digital world and an analog world. Specifically, the optical ADC converts the analog signal into the digital signal through three processes: sampling, quantization, and encoding.

In recent years, with the rapid development of photonics technologies, especially the emergence of mode-locked lasers with a high repetition rate and a low time jitter, implementation of the optical ADC has become a research focus in recent 30 years. The optical ADC converts the analog signal into the digital signal in an optical domain through three processes: sampling, quantization, and encoding.

At present, sampling and encoding technologies in the optical domain are relatively mature. Therefore, technical difficulties and emphases of implementing the optical ADC mainly focus on an all-optical quantization technology. In a commonly used all-optical quantization technology, intensity information of a sampled optical pulse is mainly converted into a spectral change of the optical pulse through a nonlinear effect, and the spectral change is processed by using a wavelength processing device, so as to implement optical quantization.

SUMMARY

This application provides a signal processing apparatus and a signal processing method, to implement optical quantization based on an intensity of a sampled optical pulse signal, so as to convert an analog signal into a digital signal more efficiently.

According to a first aspect, this application provides a signal processing apparatus, where the signal processing apparatus includes a sampling unit, a beam combiner, and an optical resonator. The sampling unit is connected to the beam combiner, and the beam combiner is connected to the optical resonator. The sampling unit is configured to sample an analog signal by using an optical pulse signal, to output a sampled optical pulse signal; the beam combiner is configured to combine the sampled optical pulse signal and a multi-wavelength optical signal into a first optical signal; and the optical resonator is configured to perform resonance based on the first optical signal, to output a second optical signal in the first optical signal, where a wavelength of the second optical signal is equal to a resonant wavelength of the optical resonator.

According to the signal processing apparatus in this application, an amplitude of the analog signal represents an intensity of the sampled pulse optical signal by using the sampling unit. Then, the beam combiner combines the multi-wavelength optical signal and the sampled optical pulse signal into the first optical signal, and transmits the first optical signal to the optical resonator. Under an action of a frequency shift of a resonant spectral line caused by an intensity of the first optical signal, the optical resonator can obtain, through screening, the second optical signal whose wavelength is equal to the resonant wavelength of the optical resonator and that is in the first optical signal, to implement intensity-to-wavelength mapping, that is, implement amplitude-to-wavelength mapping of the analog signal. In this way, when second optical signals with different wavelengths are used for encoding to obtain different digital signals, wavelength-to-digital signal mapping may be implemented, that is, conversion from the analog signal to a digital signal is implemented.

Compared with implementing intensity-to-frequency mapping of an optical signal through a nonlinear optical fiber, implementing intensity-to-frequency mapping by the optical resonator based on the intensity of the first optical signal can reduce a size of the signal processing apparatus. On the other hand, requirement on the intensity of the optical pulse signal is lower.

In addition, compared with providing the multi-wavelength optical signal for the optical resonator through the nonlinear optical fiber, that the beam combiner combines the multi-wavelength optical signal and the sampled optical pulse signal into the first optical signal and provides the first optical signal for the optical resonator can save a large space occupied by an optical fiber, so that the size of the signal processing apparatus can be reduced.

With reference to the first aspect, in a first possible implementation, the signal processing apparatus further includes a multi-wavelength optical signal source, the multi-wavelength optical signal source is connected to the beam combiner, and the multi-wavelength optical signal source is configured to output the multi-wavelength optical signal.

With reference to the first possible implementation, in a second possible implementation, the multi-wavelength optical signal source includes a plurality of lasers, where the plurality of lasers jointly output the multi-wavelength optical signal. Alternatively, the multi-wavelength optical signal source includes a wide-spectrum light source and a dicing filter, where the dicing filter is configured to dice a spectrum of an optical signal output by the wide-spectrum light source, to output the multi-wavelength optical signal, where the multi-wavelength optical signal includes a plurality of spectral components obtained through dicing. Alternatively, the multi-wavelength optical signal source includes a super-continuous spectrum light source and a dicing filter, where the dicing filter is configured to dice a spectrum of an optical signal output by the super-continuous spectrum light source, to output the multi-wavelength optical signal, where the multi-wavelength optical signal includes a plurality of spectral components obtained through dicing. Alternatively, the multi-wavelength optical signal source includes a multi-band fiber laser, where the multi-band fiber laser is configured to output the multi-wavelength optical signal. Alternatively, the multi-wavelength optical signal source includes a comb light source, where the comb light source is configured to output the multi-wavelength optical signal.

With reference to the first aspect or the first or the second possible implementation, in a third possible implementation, the signal processing apparatus may further include a filter, and the filter is connected to the optical resonator. The filter is configured to filter out an optical signal other than the second optical signal in the optical signal received from the optical resonator, to output the second optical signal.

An optical signal with another wavelength, a noise signal, and the like may be filtered out by filtering the second optical signal by using the filter. In this way, when the second optical signal is used for encoding, the digital signal obtained through encoding is more accurate.

With reference to the third possible implementation, in a fourth possible implementation, the signal processing apparatus further includes a wavelength division demultiplexer, and the wavelength division demultiplexer is connected to the filter. The wavelength division demultiplexer is configured to: separate optical carriers with different wavelengths in the optical signal received from the filter, and output, from different output ports, the optical carriers with different wavelengths obtained through separation, where the optical carrier includes the second optical signal.

Sequence number information of the output port from which the wavelength division demultiplexer outputs the second optical signal may be used as a digital optical signal corresponding to the analog signal.

With reference to the third possible implementation, in a fifth possible implementation, the signal processing apparatus further includes an optical switch unit, and the optical switch unit is connected to the filter. The optical switch unit is configured to: when receiving a first clock signal, output the second optical signal, where a clock frequency of the first clock signal is the same as a clock frequency of the optical pulse signal.

In this implementation, the optical switch unit controls an output clock frequency of the second optical signal, and the output clock frequency of the second optical signal is the same as the clock frequency of the optical pulse signal, so that the second optical signal is encoded only when the sampling unit performs sampling, to avoid encoding an unwanted signal.

With reference to the first aspect or the first or the second possible implementation, in a sixth possible implementation, the signal processing apparatus further includes an optical switch unit, and the optical switch unit is connected to the optical resonator. The optical switch unit is configured to: when receiving a first clock signal, output the second optical signal, where a clock frequency of the first clock signal is the same as a clock frequency of the optical pulse signal.

In this implementation, the optical switch unit controls an output clock frequency of the second optical signal, and the output clock frequency of the second optical signal is the same as the clock frequency of the optical pulse signal, so that encoding of the second optical signal is implemented when the sampling unit performs sampling, to avoid encoding an unwanted signal.

With reference to the fifth or the sixth possible implementation, in a seventh possible implementation, the signal processing apparatus further includes a wavelength division demultiplexer, and the wavelength division demultiplexer is connected to the optical switch unit. The wavelength division demultiplexer is configured to output the second optical signal from a port corresponding to the wavelength of the second optical signal.

Sequence number information of the output port from which the wavelength division demultiplexer outputs the second optical signal may be used as a digital optical signal corresponding to the analog signal.

With reference to the first aspect or the first possible implementation or the second possible implementation, in an eighth possible implementation, the signal processing apparatus further includes a wavelength division demultiplexer, and the wavelength division demultiplexer is connected to the optical resonator. The wavelength division demultiplexer is configured to: separate optical carriers with different wavelengths in the optical signal received from the optical switch unit, and output, from different output ports, the optical carriers with different wavelengths obtained through separation, where the optical carrier includes the second optical signal.

Sequence number information of the output port from which the wavelength division demultiplexer outputs the second optical signal may be used as a digital optical signal corresponding to the analog signal.

With reference to the fourth, the seventh, or the eighth possible implementation, in a ninth possible implementation, the signal processing apparatus further includes an optical cross-connection structure, the optical cross-connection structure includes N output ports, and the optical cross-connection structure is connected to the wavelength division demultiplexer. The optical cross-connection structure is configured to output the second optical signal from M output ports in the N output ports, to encode the analog signal into a binary digital optical signal having precision of N bits, where N is a positive integer.

With reference to the ninth possible implementation, in a tenth possible implementation, the signal processing apparatus further includes an optical-to-electrical conversion unit, and the optical-to-electrical conversion unit is connected to the optical cross-connection structure. The optical-to-electrical conversion unit is configured to convert the received optical signal into an electrical signal.

With reference to the tenth possible implementation, in an eleventh possible implementation, the optical-to-electrical conversion unit is specifically configured to: when receiving a second clock signal, convert the second optical signal into the electrical signal, Where a clock frequency of the second clock signal is the same as the clock frequency of the optical pulse signal.

With reference to the fourth or the eighth possible implementation, in a twelfth possible implementation, the signal processing apparatus further includes an optical switch unit, and the optical switch unit is connected to the wavelength division demultiplexer. The optical switch unit is configured to: when receiving a first clock signal, output the second optical signal, where a clock frequency of the first clock signal is the same as a clock frequency of the optical pulse signal.

With reference to the twelfth possible implementation, in a thirteenth possible implementation, the signal processing apparatus further includes an optical cross-connection structure, the optical cross-connection structure includes N output ports, and the optical cross-connection structure is connected to the optical switch unit. The two-dimensional optical cross-connection structure is configured to output the second optical signal from M output ports in the N output ports, to encode the analog signal into a binary digital optical signal having precision of N bits.

With reference to the thirteenth possible implementation, in a fourteenth possible implementation, the signal processing apparatus further includes an optical-to-electrical conversion unit, and the optical-to-electrical conversion unit is connected to the optical cross-connection structure. The optical-to-electrical conversion unit is configured to convert the received optical signal into an electrical signal.

With reference to the fourteenth possible implementation, in a fifteenth possible implementation, the optical-to-electrical conversion unit is specifically configured to: when receiving a second clock signal, convert the second optical signal into the electrical signal, where a clock frequency of the second clock signal is the same as the clock frequency of the optical pulse signal.

With reference to the first aspect or any one of the foregoing possible implementations, in a sixteenth possible implementation, the sampling unit includes a pulse laser and an electro-optic modulator. The pulse laser is configured to output the optical pulse signal; and the electro-optic modulator is configured to sample the analog signal by using the optical pulse signal, to obtain the sampled optical pulse signal.

With reference to the first aspect or any one of the foregoing possible implementations, in a seventeenth possible implementation, one or more components in the signal processing apparatus are integrated on a silicon-based chip.

According to a second aspect, an embodiment of this application provides a signal processing method. The signal processing method includes: sampling an analog signal by using an optical pulse signal, to obtain a sampled optical pulse signal; combining the sampled optical pulse signal and a multi-wavelength optical signal into a first optical signal; and adjusting a resonant spectral line of an optical resonator based on an intensity of the first optical signal, to obtain a second optical signal in the first optical signal, where a wavelength of the second optical signal is the same as a resonant wavelength of the optical resonator.

In the signal processing method in this application, an amplitude of the analog signal represents an intensity of sampled pulse light, and then the multi-wavelength optical signal and the sampled optical pulse signal are combined into the first optical signal. Under an action of a frequency shift of a resonant spectral line caused by the intensity of the first optical signal, the second optical signal whose wavelength is equal to the resonant wavelength of the optical resonator and that is in the first optical signal is obtained through screening, to implement intensity-to-wavelength mapping, that is, implement amplitude-to-wavelength mapping of the analog signal. In this way, when second optical signals with different wavelengths are used for encoding to obtain different digital signals, wavelength-to-digital signal mapping may be implemented, that is, conversion from the analog signal to a digital signal is implemented.

With reference to the second aspect, in a first possible implementation, the signal processing method further includes: performing encoding processing on the second optical signal to obtain a digital signal.

With reference to the first possible implementation, in a second possible implementation, a clock frequency for the sampling is the same as a clock frequency for the encoding.

In this implementation, the clock frequency for the encoding is the same as the clock frequency for the sampling, so that encoding is performed only when sampling is performed, to help avoid encoding an unwanted signal.

With reference to the first or the second possible implementation, in a third possible implementation, before the performing encoding processing on the second optical signal, the signal processing method further includes: performing filtering processing on the second optical signal.

An optical signal with another wavelength, a noise signal, and the like may be filtered out by filtering the second optical signal by using the filter. In this way, when the second optical signal is used for encoding, the digital signal obtained through encoding is more accurate.

According to a third aspect, this application provides an optical analog-to-digital converter, where the optical analog-to-digital converter includes the signal processing apparatus according to the first aspect or any one of the possible implementations of the first aspect.

DESCRIPTION OF EMBODIMENTS

The following describes technical solutions of this application with reference to accompanying drawings.

Figure 1:
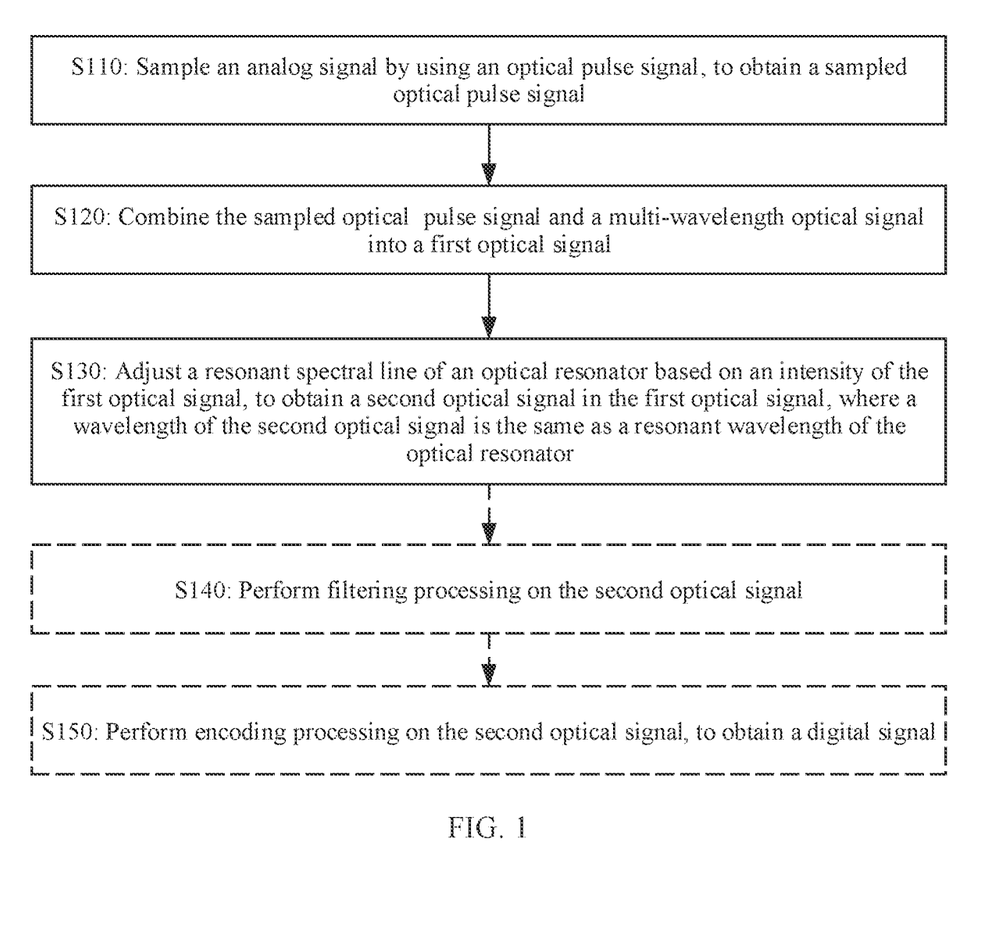
FIG. 1 is a schematic flowchart of a signal processing method according to an embodiment of this application.

FIG. 1 is a schematic flowchart of a signal processing method 100 according to an embodiment of this application. The method 100 includes at least S110, S120, and S130.

S110: Sample an analog signal by using an optical pulse signal, to obtain a sampled optical pulse signal.

Specifically, the analog signal is loaded onto the optical pulse signal for sampling, to obtain the sampled optical pulse signal having a specific intensity envelope. The intensity envelope of the sampled optical pulse signal corresponds to an intensity envelope of the analog signal. The intensity herein may be understood as a power, that is, powers of sampled optical pulse signals having different intensities are different.

Figure 2:
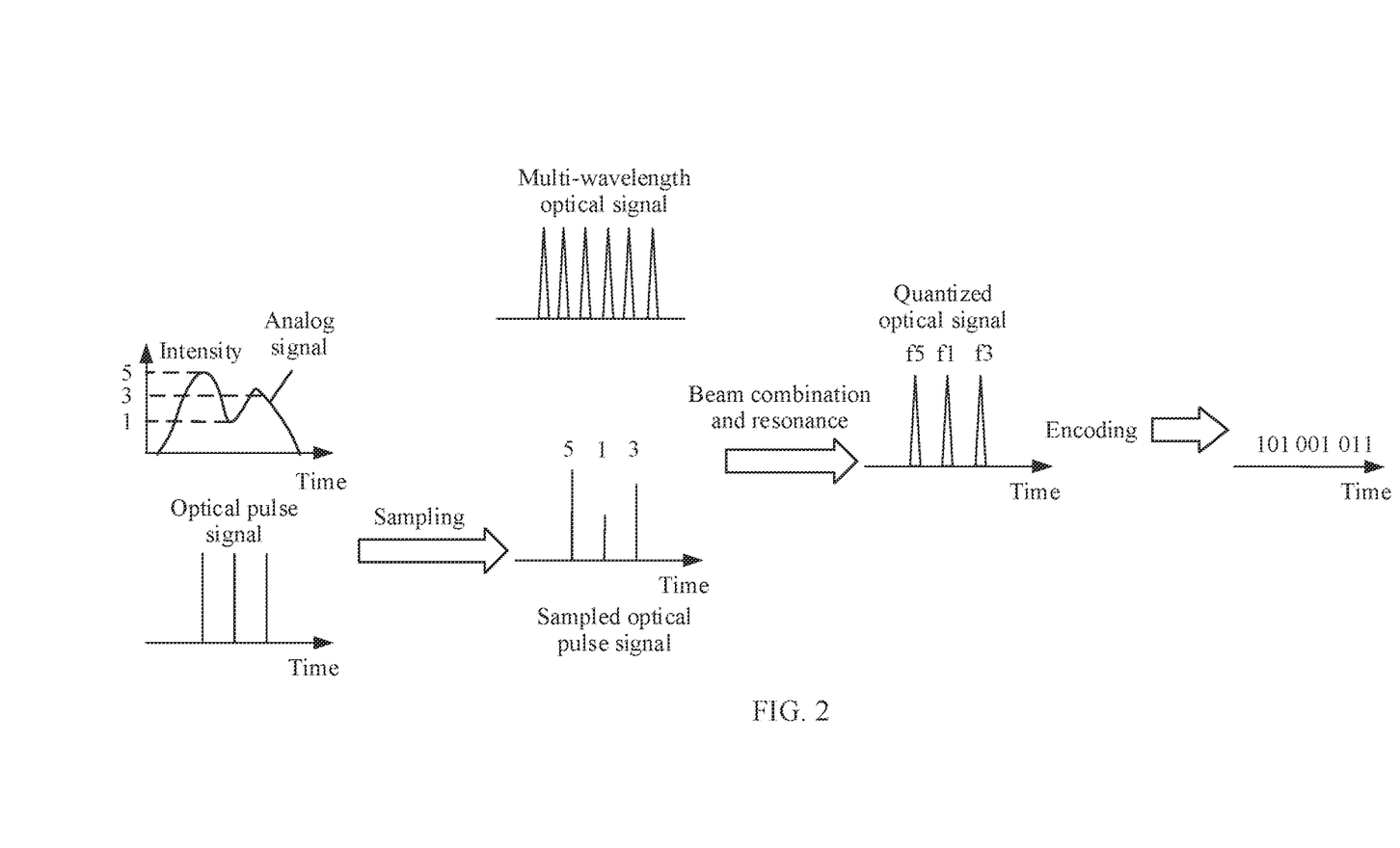
FIG. 2 is a schematic diagram of signal conversion according to an embodiment of this application.

A sampling operation in FIG. 2 is used as an example. The analog signal is loaded onto the optical pulse signal, to sequentially obtain sampled optical pulse signals whose intensities are 3, 1, and 5.

S120: Combine the sampled optical pulse signal and a multi-wavelength optical signal into a first optical signal.

In other words, the sampled optical pulse signal and the multi-wavelength optical signal are combined into one beam of light, and the light obtained through combination is referred to as the first optical signal.

Generally, an intensity of sampled optical pulse signal is greater than an intensity of the multi-wavelength optical signal, and a wavelength of the sampled optical pulse signal is a single wavelength. The multi-wavelength optical signal has a plurality of wavelength components.

Assuming that the wavelength of the sampled pulse light is λ0, and the plurality of wavelength components of the multi-wavelength optical signal include λ1, λ3, and λ5, an intensity of the first optical signal obtained through combination is approximately equal to the intensity of the sampled pulse light, and the first optical signal also includes wavelength components λ0, λ1, λ3, and λ5.

If a wavelength is equivalent to a frequency, and it is assumed that λ0 corresponds to f0, λ1 corresponds to f1, λ3 corresponds to f3, and λ5 corresponds to f5, the intensity of the first optical signal is approximately equal to the intensity of the sampled pulse light, and frequency components of the first optical signal include f0, f1, f3, and f5.

As shown in FIG. 2, the multi-wavelength optical signal may include optical signals whose frequencies are f1, f3, and f5.

S130: Adjust a resonant spectral line of an optical resonator based on the intensity of the first optical signal, to obtain a second optical signal in the first optical signal, where a wavelength of the second optical signal is the same as a resonant wavelength of the optical resonator.

Specifically, under an action of a frequency shift of the resonant spectral line caused by the intensity of the first optical signal, an optical signal (the optical signal is the second optical signal) whose wavelength is equal to the resonant wavelength of the optical resonator and that is in the first optical signal is obtained through screening, to implement intensity-to-wavelength mapping, that is, implement amplitude-to-wavelength mapping of the analog signal, so as to complete quantization of the optical signal. In this way, when second optical signals with different wavelengths are used for encoding to obtain different digital signals, wavelength-to-digital signal mapping may be implemented, that is, conversion from the analog signal to a digital signal is implemented. The "intensity-to-wavelength" mapping may also be referred to as "intensity-to-frequency" mapping.

As shown in FIG. 2, the first optical signal obtained through combination in S120 includes a sampled pulse optical signal whose intensity is 3, and optical signals whose frequencies are f1, f3, and f5. In this case, assuming that a frequency corresponding to a resonant wavelength used when resonance is performed based on the optical signal whose intensity is 3 is f3, the second optical signal is an optical signal with the frequency f3. The first optical signal obtained through combination in S120 includes a sampled pulse optical signal whose intensity is 1, and the optical signals whose frequencies are f1, f3, and f5. In this case, assuming that a frequency corresponding to a resonant wavelength used when resonance is performed based on the optical signal whose intensity is 1 is f1, the second optical signal is an optical signal with the frequency f1. The first optical signal obtained through combination in S120 includes a sampled pulse optical signal whose intensity is 5, and the optical signals whose frequencies are f1, f3 and f5. In this case, assuming that a frequency corresponding to a resonant wavelength used when resonance is performed based on the optical signal whose intensity is 5 is f5, the second optical signal is an optical signal with the frequency f5.

In this embodiment of this application, the multi-wavelength optical signal and the sampled optical pulse signal are combined to provide an optical signal whose wavelength is equal to the resonant wavelength for the optical resonator, to implement "intensity-to-frequency" mapping. However, in the conventional technology, a spectrum of the sampled optical pulse signal is mainly expanded by using a nonlinear optical fiber, so that an expanded spectrum includes a frequency corresponding to the intensity of the sampled optical pulse signal, to implement the "intensity-to-frequency" mapping. Compared with that in the conventional technology, the signal processing method in this embodiment of this application can reduce a size of an apparatus for performing the signal processing method, and lower a requirement on the optical pulse signal.

Optionally, the signal processing method in this embodiment of this application may further include S150: Perform encoding processing on the second optical signal, to obtain a digital signal. Second optical signals with different frequencies are encoded to obtain different digital signals.

For example, as shown in FIG. 2, a second optical signal whose frequency is f3 is encoded to obtain a binary digital signal 011; a second optical signal whose frequency is f1 is encoded to obtain a binary digital signal 001; and a second optical signal whose frequency is f5 is encoded to obtain a binary digital signal 101.

Optionally, a clock frequency at which the second optical signal is encoded in S150 may be the same as a clock frequency at which the analog signal is sampled by using the optical pulse signal in S110. In other words, the second optical signal is encoded only when the analog signal is sampled by using the optical pulse signal. In this way, encoding an unnecessary optical signal can be avoided.

Optionally, before performing encoding processing on the second optical signal, that is, before performing S150, the signal processing method in this embodiment of this application may further include S140: Perform filtering processing on the second optical signal.

An optical signal with another wavelength, a noise signal, and the like may be filtered out by filtering the second optical signal. In this way, when the second optical signal is used for encoding, the digital signal obtained through encoding is more accurate.

Based on the foregoing described signal processing method, the following describes a signal processing apparatus in this application. It should be understood that a connection described in the embodiments of this application may be a direct connection, or may be a connection made through another component.

Figure 3:
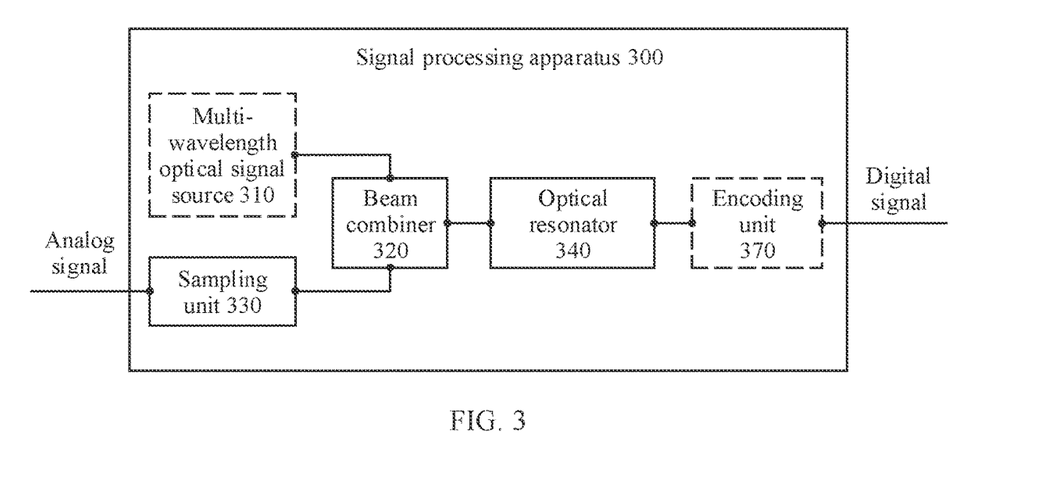
FIG. 3 is a schematic diagram of a structure of a signal processing apparatus according to an embodiment of this application.

FIG. 3 shows an example structure of a signal processing apparatus 300 according to an embodiment of this application. The signal processing apparatus 300 includes a sampling unit 330, a beam combiner 320, and an optical resonator 340.

The sampling unit 330 is connected to the beam combiner 320, and the beam combiner 320 is connected to the optical resonator 340. Specifically, an output port of the sampling unit 330 is connected to an input port of the beam combiner 320, and an output port of the beam combiner 320 is connected to an input port of the optical resonator 340.

The sampling unit 330 is configured to perform the operation in S110, to be specific, receive an analog signal, and sample the analog signal by using an optical pulse signal, to output a sampled optical pulse signal. The sampling unit 330 may also be referred to as a sampler or a sampling module. The sampling unit 330 may be a single component, or may be a combination of a plurality of components.

The beam combiner 320 is configured to perform the operation in S120, to be specific, receive a multi-wavelength optical signal and the sampled pulse optical signal that is output by the sampling unit 330, and combine the sampled optical pulse signal and the multi-wavelength optical signal into a first optical signal.

The optical resonator 340 is configured to perform the operation in S130, that is, receive the first optical signal output by the beam combiner 320, and perform resonance based on the first optical signal, to output a second optical signal in the first optical signal, where a wavelength of the second optical signal is equal to a resonant wavelength of the optical resonator 340.

The optical resonator 340 in this embodiment of this application may be a microring resonator, a microdisk resonator, a grating Fabry-Perot (FP) resonator, or the like. Certainly, the optical resonator 340 in this embodiment of this application is not limited to these several types of resonators. Any resonator that can perform resonance based on an intensity of an optical signal, to output an optical signal having a corresponding frequency may fall within the protection scope of the optical resonator in this embodiment of this application.

Due to a nonlinear effect, an incident optical signal changes an effective refractive index of the optical resonator 340, and optical signals with different intensities cause different effective refractive index changes. Therefore, the optical resonator 340 outputs optical signals with different wavelengths from a drop port, that is, outputs optical signals with different frequencies, to implement intensity-to-frequency mapping and complete optical quantization.

The microring resonator is used as an example. In an optical signal incident on the microring resonator, light whose wavelength meets a condition $n_{eff}*\pi*D=m*\lambda$ is resonated in the microring resonator, and finally an optical signal with this wavelength is output, where the wavelength is referred to a resonant wavelength. $\lambda$ represents the resonant wavelength; $n_{eff}$ represents an effective refractive index of a microring resonator; D represents a diameter of the microring resonator; and m is an integer.

Optionally, the signal processing apparatus 300 may further include a multi-wavelength optical signal source 310. As the name implies, the multi-wavelength optical signal source 310 is configured to provide a multi-wavelength optical signal.

When the signal processing apparatus 300 includes the multi-wavelength optical signal source 310, the multi-wavelength optical signal source 310 is connected to the beam combiner 320. Specifically, an output port of the multi-wavelength optical signal source 310 is connected to the input port of the beam combiner 320. Alternatively, the signal processing apparatus 300 may reserve an interface, and the interface may be externally connected to the multi-wavelength optical signal source.

Generally, an intensity of light output by the multi-wavelength optical signal source is less than an intensity of the optical pulse signal.

Optionally, the multi-wavelength optical signal source 310 in this embodiment of this application may include a plurality of discrete lasers, and the plurality of discrete lasers jointly output the multi-wavelength optical signal. The plurality of lasers may be discrete, or may be integrated.

Optionally, the multi-wavelength optical signal source 310 may include a wide-spectrum light source and a dicing unit. The dicing unit is configured to dice a spectrum of an optical signal output by the wide-spectrum light source, to output the multi-wavelength optical signal. The multi-wavelength optical signal includes a plurality of spectral components obtained through dicing. Alternatively, the multi-wavelength optical signal source 310 may include a super-continuous spectrum light source and a dicing unit. The dicing unit is configured to dice a spectrum of an optical signal output by the super-continuous spectrum light source, to output the multi-wavelength optical signal. The multi-wavelength optical signal includes a plurality of spectral components Obtained through dicing. An example of the dicing unit is a filter.

Specifically, the multi-wavelength optical signal source 310 may be a multi-band fiber laser or a comb light source.

Optionally, the signal processing apparatus 300 may further include an encoding unit 370. The encoding unit 370 is configured to perform the operation in S150, that is, encode the second optical signal to obtain a digital signal.

The encoding unit 370 is connected to the optical resonator 340. Specifically, an input port of the encoding unit 370 is connected to an output port from which the optical resonator 340 outputs the second optical signal.

The encoding unit 370 may also be referred to as an encoder or an encoding module. The encoding unit 370 may be a single component, or may be a combination of a plurality of components.

Figure 4:
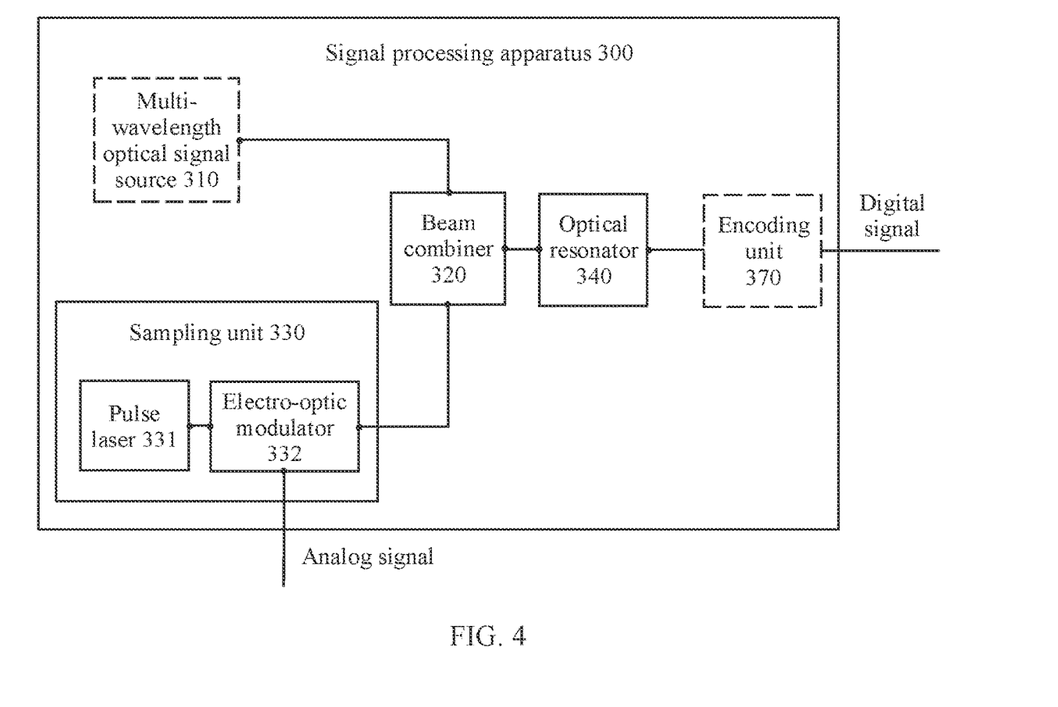
FIG. 4 is a schematic diagram of a structure of a signal processing apparatus according to another embodiment of this application.

In some possible implementations, as shown in FIG. 4, the sampling unit 330 may include a pulse laser 331 and an electro-optic modulator 332. An output port of the pulse laser 331 is connected to one input port of the electro-optic modulator 332. An output port of the electro-optic modulator 332 is used as the output port of the sampling unit 330, and is connected to the input port of the beam combiner 320; and the other input port of the electro-optic modulator 332 is used as an input port of the sampling unit 330, and is used to input the analog signal. A clock frequency of the pulse laser 331 is a sampling clock frequency of the sampling unit 330.

The pulse laser 331 is configured to output the optical pulse signal, and the electro-optic modulator 332 is configured to sample the analog signal by using the optical pulse signal, to output the sampled optical pulse signal.

Optionally, the pulse laser may be a mode-locked pulse laser, a Q-switched pulse laser, or the like, and the electro-optic modulator may be a Mach-Zehnder (MZ) modulator, a microring modulator, an electro-absorption modulator, or the like.

Figure 5:
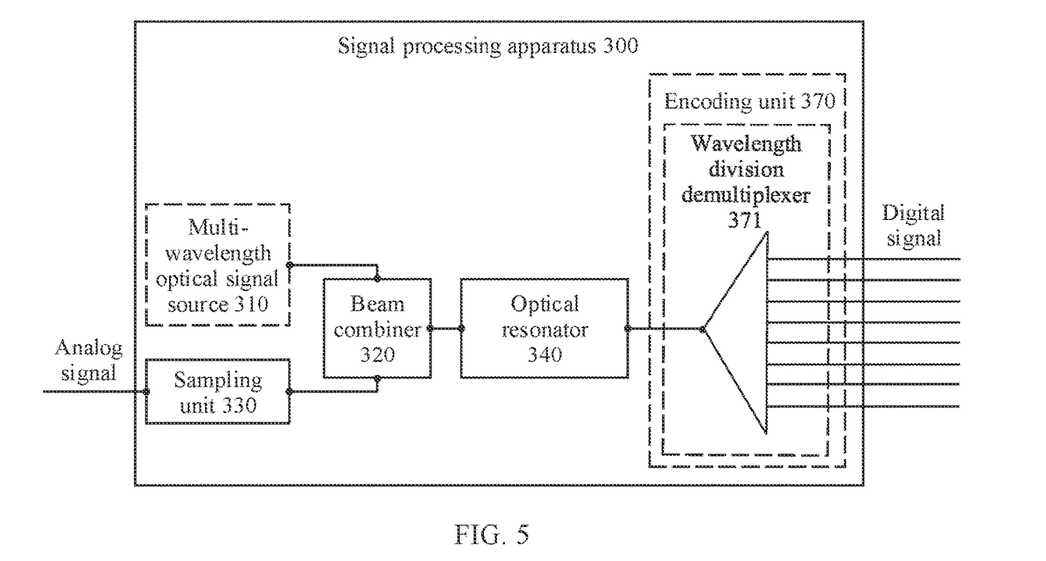
FIG. 5 is a schematic diagram of a structure of a signal processing apparatus according to still another embodiment of this application.

When the signal processing apparatus 300 includes the encoding unit 370, in some possible implementations, as shown in FIG. 5, the encoding unit 370 may include a wavelength division demultiplexer (DEMUR) 371. An input port of the wavelength division demultiplexer 371 is used as the input port of the encoding unit 370, and is connected to the output port from which the optical resonator 340 outputs the second optical signal.

The wavelength division demultiplexer 371 is configured to receive the optical signal output by the optical resonator 340, separate optical carriers with different wavelengths in the optical signal, and output, from different output ports, the optical carriers with different wavelengths obtained through separation, where the optical carrier obtained through separation includes the second optical signal.

The wavelength division demultiplexer may also be referred to as a wavelength division demultiplexer, an optical demultiplexer, or an optical demultiplexer.

In some possible implementations, a sequence number of a port from which the wavelength division demultiplexer 371 outputs the second optical signal may be understood as a digital signal corresponding to the second optical signal, that is, a digital signal corresponding to the analog signal. For example, the wavelength division demultiplexer 371 includes eight output ports. If the second optical signal is output from a third output port of the wavelength division demultiplexer 371, it may be understood that an optical digital signal obtained by encoding the analog signal is 3.

Figure 6:
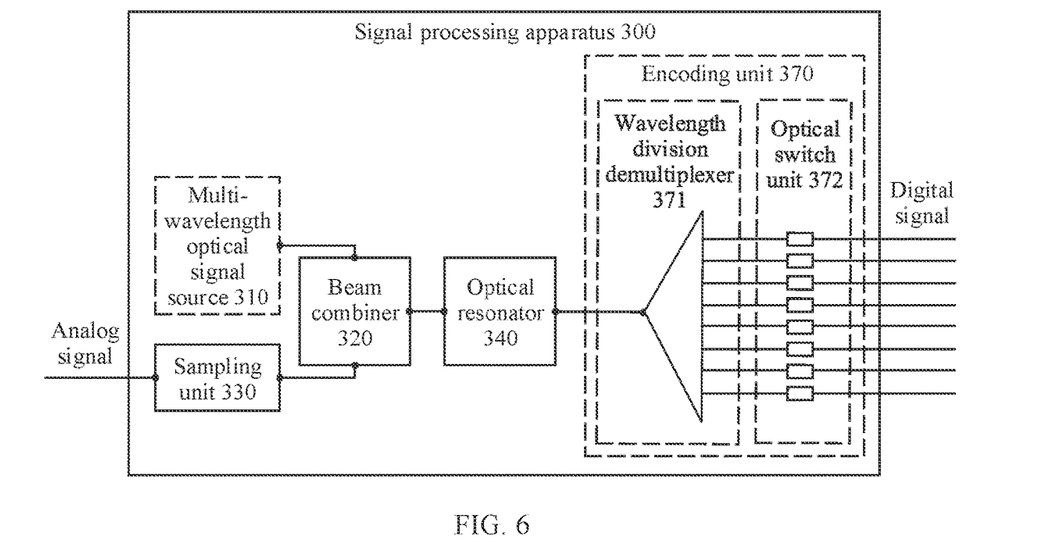
FIG. 6 is a schematic diagram of a structure of a signal processing apparatus according to yet another embodiment of this application.

When the encoding unit 370 includes the wavelength division demultiplexer 371, in some possible implementations, as shown in FIG. 6, the encoding unit 370 may further include an optical switch unit 372, where the optical switch unit 372 may include an optical switch array, and each row of optical switches in the optical switch array are connected to one output port of the wavelength division demultiplexer 371.

The optical switch unit 372 is configured to receive a clock signal and an optical signal that is output by the wavelength division demultiplexer 371. When receiving the clock signal, the optical switch unit 372 outputs the optical signal received from the wavelength division demultiplexer 371. When receiving no clock signal, the optical switch unit 372 does not output the optical signal received from the wavelength division demultiplexer 371. A frequency of the clock signal of the optical switch unit 372 is the same as the sampling clock frequency of the sampling unit 330, to prevent the encoding unit 370 from outputting an unnecessary digital signal.

For example, when the sampling unit 330 includes a pulse laser, the clock signal of the optical switch unit 372 may be the same as a clock signal of the pulse laser. Further, the clock signal of the pulse laser may be used as the clock signal of the optical switch unit 372. In this way, conversing an unnecessary signal can be avoided.

Each row of optical switches may include one or more optical switches. If a plurality of optical switches are included, clock signals of the plurality of optical switches need to have a same frequency.

Figure 7:
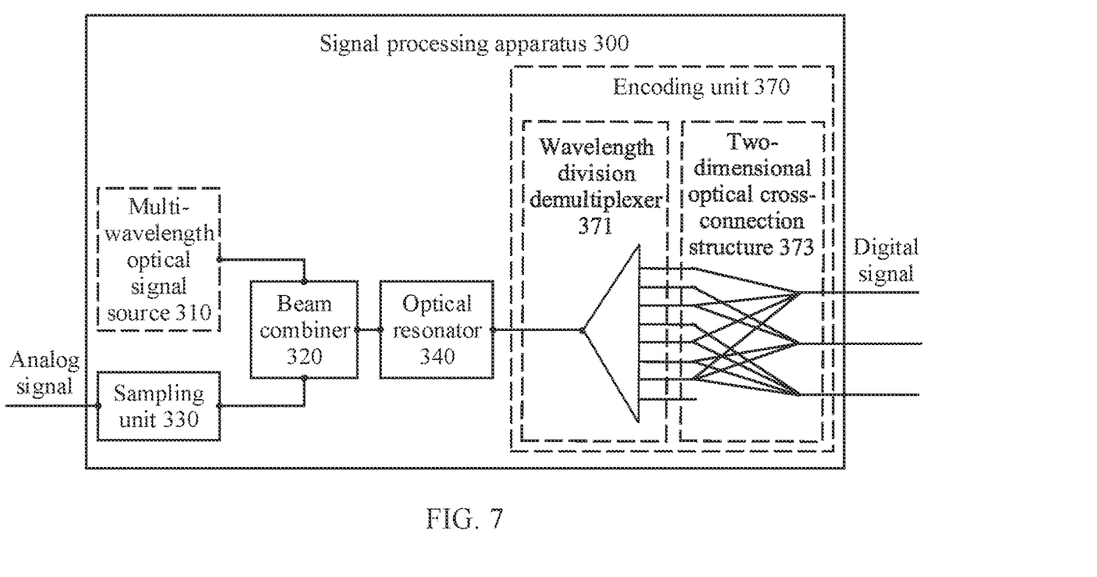
FIG. 7 is a schematic diagram of a structure of a signal processing apparatus according to still yet another embodiment of this application.

When the encoding unit 370 includes the wavelength division demultiplexer 371, in other possible implementations, as shown in FIG. 7, the encoding unit 370 may further include a two-dimensional optical cross-connection structure 373. An input port of the two-dimensional optical cross-connection structure 373 is connected to an output port of the wavelength division demultiplexer 371; and an output port of the two-dimensional optical cross-connection structure 373 is used as an output port of the encoding unit 370, and outputs a binary optical digital signal having precision of 3 bits.

For example, if the third output port of the wavelength division demultiplexer 371 outputs the second optical signal, the second optical signal is output from a first output port and a second output port of the two-dimensional optical cross-connection structure 373 after passing through the two-dimensional optical cross-connection structure 373. Assuming that outputting an optical signal from the output port of optical cross-connection structure 373 is recorded as "1" in binary, outputting no optical signal from the output port of the optical cross-connection structure 373 is recorded as "0" in binary. In this case, outputting the second optical signal from the first output port and the second output port of the two-dimensional optical cross-connection structure 373 may be understood as that the analog signal is encoded into a binary optical digital signal "011".

It should be understood that the optical cross-connection structure in FIG. 7 is merely an example, and the optical cross-connection structure in the encoding unit 370 is not limited thereto. For example, when a binary digital signal having higher encoding precision needs to be output, a quantity of cross-connections of the optical cross-connection structure and a quantity of output ports may be increased.

Optionally, in the signal processing apparatus shown in FIG. 7, the wavelength division demultiplexer 371 may be connected to the optical cross-connection structure 373 through an optical switch unit. Alternatively, an optical switch unit may be connected after the optical cross-connection structure 373. For content of the optical switch unit, refer to the optical switch unit 372 in FIG. 6. Details are not described herein again.

Figure 8:
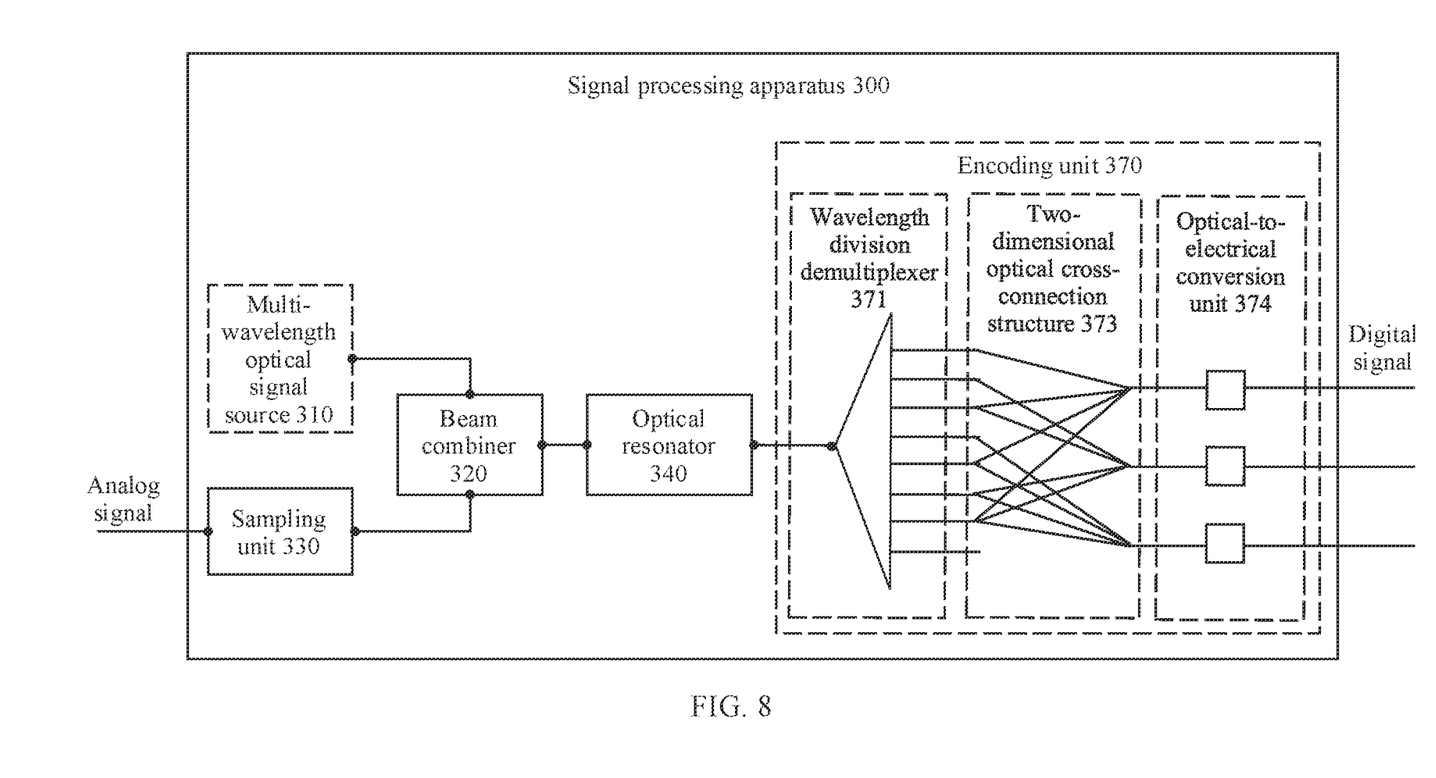
FIG. 8 is a schematic diagram of a structure of a signal processing apparatus according to a further embodiment of this application.

When the encoding unit 370 includes the wavelength division demultiplexer 371 and the optical cross-connection structure 373, in some possible implementations, as shown in FIG. 8, the encoding unit 370 may further include an optical-to-electrical conversion unit 374. An input port of the optical-to-electrical conversion unit 374 is connected to the output port of the optical cross-connection structure 373; and an output port of the optical-to-electrical conversion unit 374 is used as the output port of the encoding unit 370, and outputs the digital signal corresponding to the analog signal.

The optical-to-electrical conversion unit 374 is configured to receive the optical digital signal output by the optical cross-connection structure 373, and convert the optical digital signal into an electrical digital signal.

The optical-to-electrical conversion unit 374 may also be referred to as an optical-to-electrical converter or an optical-to-electrical conversion component. The optical-to-electrical conversion unit 374 may be a single component, or may be a combination of a plurality of components.

Optionally, the optical-to-electrical conversion unit 374 may further receive a clock signal, and convert the optical signal into an electrical signal only when receiving the clock signal.

Optionally, a clock frequency of the clock signal of the optical-to-electrical conversion unit 374 may be the same as a clock frequency of the optical pulse signal in the sampling unit 330. For example, when the sampling unit 330 includes the pulse laser, the clock signal of the optical-to-electrical conversion unit 374 may be the same as the clock signal of the pulse laser. Further, the clock signal of the pulse laser may be used as the clock signal of the optical-to-electrical conversion unit 374. In this way, the optical-to-electrical conversion unit 374 may perform signal conversion only when the sampling unit 330 performs sampling. This can avoid conversion of an unnecessary signal.

In some possible implementations, the optical-to-electrical conversion unit 374 includes a photodetector. The photodetector, also known as an "optical detector", is configured to detect an optical power of light incident to a surface of the photodetector, and convert a change of the optical power into a corresponding current, to complete digital encoding of the optical signal. An example of the photodetector is a photodiode (PD) array.

It should be understood that, in the signal processing apparatus shown in FIG. 8, the wavelength division demultiplexer 371 may be connected to the optical cross-connection structure 373 through an optical switch unit. The optical cross-connection structure 373 may be connected to the photodetector through an optical switch unit. For related content of the optical switch unit, refer to the optical switch unit 372 in FIG. 6. Details are not described herein again.

In the signal processing apparatus 300, one or more of the sampling unit 330, the beam combiner 320, and the optical resonator 340 may be implemented on a silicon-based platform. For example, when the sampling unit 330 includes the pulse laser and the electro-optic modulator, the electro-optic modulator, the beam combiner 320, and the optical resonator 340 may be integrated on a silicon-based chip, and the pulse laser may be mounted on the silicon-based chip in a hybrid integration manner.

For another example, when the sampling unit 330 includes the pulse laser and the electro-optic modulator, and the signal processing apparatus 300 further includes the encoding unit 370, the electro-optic modulator, the beam combiner 320, the optical resonator 340, and the encoding unit 370 may be integrated on a silicon-based chip, and the pulse laser may be mounted on the silicon-based chip in a hybrid integration manner.

For example, when the sampling unit 330 includes the pulse laser and the electro-optic modulator, and the signal processing apparatus 300 further includes the multi-wavelength optical signal source, the electro-optic modulator, the beam combiner 320, and the optical resonator 340 may be integrated on a silicon-based chip, and the pulse laser and the multi-wavelength optical signal source 310 may be mounted on the silicon-based chip in a hybrid integration manner.

For example, when the sampling unit 330 includes the pulse laser and the electro-optic modulator, and the signal processing apparatus 300 further includes the multi-wavelength optical signal source 310 and the encoding unit 370, the electro-optic modulator, the beam combiner 320, the optical resonator 340, and the encoding unit 370 may be integrated on a silicon-based chip, and the pulse laser and the multi-wavelength optical signal source 310 may be mounted on the silicon-based chip in a hybrid integration manner.

Figure 9:
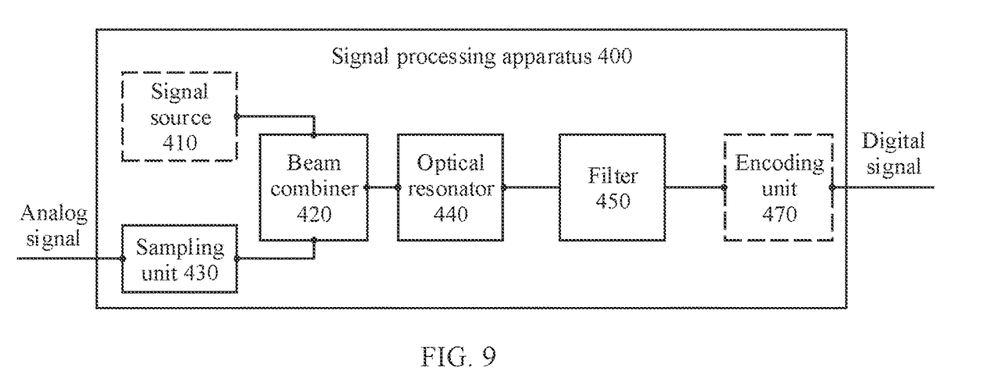
FIG. 9 is a schematic diagram of a structure of a signal processing apparatus according to a still further embodiment of this application.

FIG. 9 is a diagram of an example structure of a signal processing apparatus 400 according to another embodiment of this application. The signal processing apparatus 400 includes at least a sampling unit 430, a beam combiner 420, an optical resonator 440, and a filter 450.

For related content of the sampling unit 430, the beam combiner 420, and the optical resonator 440, refer to the sampling unit 330, the beam combiner 320, and the optical resonator 340 respectively. Details are not described herein again.

An input port of the filter 450 is connected to an output port of the optical resonator 440, and is used to filter an optical signal output by the optical resonator 440. Specifically, after the optical signal output by the optical resonator 440 is input into the filter 450, the filter 450 filters out a signal other than a second optical signal, for example, filters out a noise signal, and outputs only the second optical signal. This increases a signal-to-noise ratio of the output second optical signal.

Optionally, the signal processing apparatus 400 may further include a multi-wavelength optical signal source 410. For related content of the multi-wavelength optical signal source 410, refer to the multi-wavelength optical signal source 310. Details are not described herein again.

Optionally, the signal processing apparatus 400 may further include an encoding unit 470. For related content of the encoding unit 470, refer to the encoding unit 370. Details are not described herein again.

When the signal processing apparatus 400 includes the encoding unit 470, an output port of the filter 450 is connected to an input port of the encoding unit 470. When the signal processing apparatus 400 does not include the encoding unit 470, an output port of the filter 450 may be used as an output port of the signal processing apparatus 400, and is used to externally connect to the encoding unit.

For a manner of packaging the signal processing apparatus 400, refer to a manner of packaging the signal processing apparatus 300. In addition, the filter 450 may alternatively be integrated on a silicon-based chip.

Figure 10:
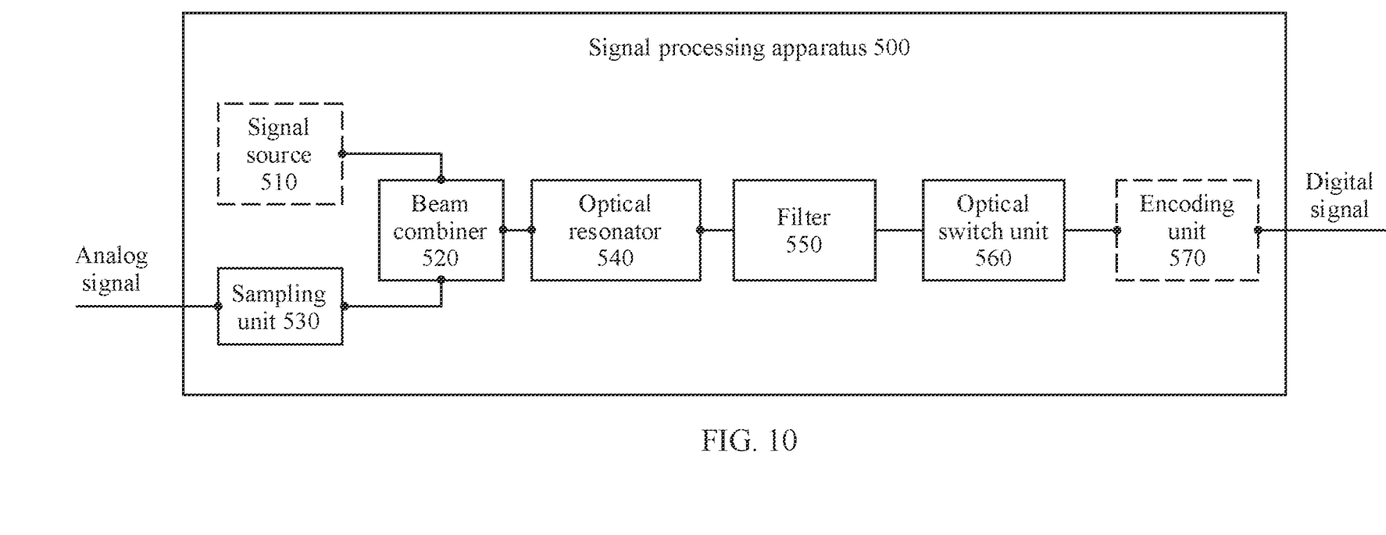
FIG. 10 is a schematic diagram of a structure of a signal processing apparatus according to a yet further embodiment of this application.

FIG. 10 is a diagram of an example structure of a signal processing apparatus 500 according to still another embodiment of this application. The signal processing apparatus 500 includes at least a sampling unit 530, a beam combiner 520, an optical resonator 540, a filter 550, and an optical switch unit 560. The filter 550 is optional.

For related content of the sampling unit 530, the beam combiner 520, and the optical resonator 540, refer to the sampling unit 330, the beam combiner 320, and the optical resonator 340 respectively. For related content of the filter 550, refer to the filter 450. Details are not described herein again.

An input interface of the optical switch unit 560 is connected to an output interface of the filter 550. The optical switch unit 560 may include an optical switch.

When receiving a clock signal, the optical switch unit 560 outputs an optical signal received from the filter 550. When receiving no clock signal, the optical switch unit 560 does not output an optical signal received from the filter 550. A clock frequency of the clock signal may be the same as a clock frequency at which the sampling unit 530 performs sampling, to avoid digital conversion of an unnecessary signal.

For example, when the sampling unit 530 includes a pulse laser, a frequency of the clock signal of the optical switch unit 560 may be the same as a frequency of a clock signal of the pulse laser. Further, the clock signal of the pulse laser may be used as the clock signal of the optical switch unit 560.

Optionally, the signal processing apparatus 500 may further include a multi-wavelength optical signal source 510. For related content of the multi-wavelength optical signal source 510, refer to a multi-wavelength optical signal source 310. Details are not described herein again.

Optionally, the signal processing apparatus 500 may further include an encoding unit 570. For related content of the encoding unit 570, refer to the encoding unit 370. Details are not described herein again.

When the signal processing apparatus 500 includes the encoding unit 570, an output port of the optical switch unit 560 is connected to an input port of the encoding unit 570. When the signal processing apparatus 500 does not include the encoding unit 570, an output port of the optical switch unit 560 may be used as an output port of the signal processing apparatus 500, and is used to externally connect to the encoding unit.

It should be understood that when the signal processing apparatus 500 includes the encoding unit 570, the encoding unit 570 may not include the optical switch unit.

For a manner of packaging the signal processing apparatus 500, refer to a manner of packaging the signal processing apparatus 300. In addition, the filter 550 and/or the optical switch unit 560 may alternatively be integrated on a silicon-based chip.

Optionally, the signal processing apparatus 500 may not include the filter 550. In this implementation, a port from which the optical resonator 540 outputs a second optical signal is connected to an input port of the optical switch unit 560.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A signal processing apparatus, comprising a sampling unit, a beam combiner, and an optical resonator, wherein:
   the sampling unit is connected to the beam combiner, and the beam combiner is connected to the optical resonator;
   the sampling unit is configured to sample an analog signal by using an optical pulse signal to output a sampled optical pulse signal;
   the beam combiner is configured to combine the sampled optical pulse signal and a multi-wavelength optical signal into a first optical signal; and
   the optical resonator is configured to perform resonance based on the first optical signal to output a second optical signal in the first optical signal, wherein a wavelength of the second optical signal is equal to a resonant wavelength of the optical resonator.

2. The signal processing apparatus according to claim 1, wherein the signal processing apparatus further comprises a multi-wavelength optical signal source, and the multi-wavelength optical signal source is connected to the beam combiner.

3. The signal processing apparatus according to claim 2, wherein the multi-wavelength optical signal source comprises one or more of the following:
   a plurality of lasers, wherein the plurality of lasers jointly output the multi-wavelength optical signal;
   a wide-spectrum light source and a dicing filter, wherein the dicing filter is configured to dice a spectrum of an optical signal output by the wide-spectrum light source to output the multi-wavelength optical signal, and wherein the multi-wavelength optical signal comprises a plurality of spectral components obtained through dicing;
   a super-continuous spectrum light source and a dicing filter, wherein the dicing filter is configured to dice a spectrum of an optical signal output by the super-continuous spectrum light source to output the multi-wavelength optical signal, and wherein a spectral component of the multi-wavelength optical signal comprises a plurality of spectral components obtained through dicing;
   a multi-band fiber laser, wherein the multi-band fiber laser is configured to output the multi-wavelength optical signal; or
   a comb light source, wherein the comb light source is configured to output the multi-wavelength optical signal.

4. The signal processing apparatus according to claim 1, wherein the signal processing apparatus further comprises a filter, the filter is connected to the optical resonator, and
   the filter is configured to filter out an optical signal other than the second optical signal in the optical signal received from the optical resonator to output the second optical signal.

5. The signal processing apparatus according to claim 4, wherein the signal processing apparatus further comprises a wavelength division demultiplexer, the wavelength division demultiplexer is connected to the filter, and
   the wavelength division demultiplexer is configured to separate optical carriers with different wavelengths in the optical signal received from the filter, and output, from different output ports, the optical carriers with different wavelengths obtained through separation, wherein the optical carriers comprise the second optical signal.

6. The signal processing apparatus according to claim 5, wherein the signal processing apparatus further comprises an optical cross-connection structure, the optical cross-connection structure comprises N output ports, the optical cross-connection structure is connected to the wavelength division demultiplexer, and
   the optical cross-connection structure is configured to output the second optical signal from M output ports in the N output ports to encode the analog signal into a binary digital optical signal having precision of N bits, wherein N is a positive integer and M is an integer less than or equal to N.

7. The signal processing apparatus according to claim 6, wherein the signal processing apparatus further comprises an optical-to-electrical conversion unit, the optical-to-electrical conversion unit is connected to the optical cross-connection structure, and
   the optical-to-electrical conversion unit is configured to convert the second optical signal received from the optical cross-connection structure into an electrical signal.

8. The signal processing apparatus according to claim 7, wherein the optical-to-electrical conversion unit is specifically configured to convert the second optical signal into the electrical signal in response to receiving a second clock signal, wherein a clock frequency of the second clock signal is the same as the clock frequency of the optical pulse signal.

9. The signal processing apparatus according to claim 5, wherein the signal processing apparatus further comprises an optical switch unit, the optical switch unit is connected to the wavelength division demultiplexer, and
   the optical switch unit is configured to output the second optical signal received from the wavelength division demultiplexer in response to receiving a first clock signal, wherein a clock frequency of the first clock signal is the same as a clock frequency of the optical pulse signal.

10. The signal processing apparatus according to claim 9, wherein the signal processing apparatus further comprises an optical cross-connection structure, the optical cross-connection structure comprises N output ports, the optical cross-connection structure is connected to the optical switch unit, and
    the optical cross-connection structure is configured to output the second optical signal from M output ports in the N output ports to encode the analog signal into a binary digital optical signal having precision of N bits, wherein N is a positive integer and M is an integer less than N.

11. The signal processing apparatus according to claim 10, wherein the signal processing apparatus further comprises an optical-to-electrical conversion unit, the optical-to-electrical conversion unit is connected to the optical cross-connection structure, and
    the optical-to-electrical conversion unit is configured to convert the second optical signal received from the optical cross-connection structure into an electrical signal.

12. The signal processing apparatus according to claim 4, wherein the signal processing apparatus further comprises an optical switch unit, the optical switch unit is connected to the filter, and the optical switch unit is configured to output the second optical signal received from the filter in response to receiving a first clock signal, wherein a clock frequency of the first clock signal is the same as a clock frequency of the optical pulse signal.

13. The signal processing apparatus according to claim 12, wherein the signal processing apparatus further comprises a wavelength division demultiplexer, the wavelength division demultiplexer is connected to the optical switch unit, and the wavelength division demultiplexer is configured to separate optical carriers with different wavelengths in the optical signal received from the optical switch unit, and output, from different output ports, the optical carriers with different wavelengths obtained through separation, wherein the optical carrier comprises the second optical signal.

14. The signal processing apparatus according to claim 1, wherein the signal processing apparatus further comprises an optical switch unit, the optical switch unit is connected to the optical resonator, and the optical switch unit is configured to output the second optical signal received from the optical resonator in response to receiving a first clock signal, wherein a clock frequency of the first clock signal is the same as a clock frequency of the optical pulse signal.

15. The signal processing apparatus according to claim 1, wherein the signal processing apparatus further comprises a wavelength division demultiplexer, the wavelength division demultiplexer is connected to the optical resonator, and the wavelength division demultiplexer is configured to separate optical carriers with different wavelengths in the optical signal received from the optical resonator, and output, from different output ports, the optical carriers with different wavelengths obtained through separation, wherein the optical carrier comprises the second optical signal.

16. The signal processing apparatus according to claim 1, wherein the sampling unit comprises a pulse laser and an electro-optic modulator, and wherein:

the pulse laser is configured to output the optical pulse signal; and the electro-optic modulator is configured to sample the analog signal by using the optical pulse signal to obtain the sampled optical pulse signal.

17. The signal processing apparatus according to claim 1, wherein one or more components in the signal processing apparatus are integrated on a silicon-based chip.

18. A signal processing method, comprising:

sampling an analog signal by using an optical pulse signal to obtain a sampled optical pulse signal;

combining the sampled optical pulse signal and a multi-wavelength optical signal into a first optical signal; and adjusting a resonant spectral line of an optical resonator based on an intensity of the first optical signal to obtain a second optical signal in the first optical signal, wherein a wavelength of the second optical signal is the same as a resonant wavelength of the optical resonator.

19. The signal processing method according to claim 18, wherein the signal processing method further comprises:

performing encoding processing on the second optical signal to obtain a digital signal.

20. The signal processing method according to claim 19, wherein a clock frequency for the sampling the analog signal is the same as a clock frequency for the encoding processing.

* * * * *